United States Patent [19]
Henderson et al.

[11] Patent Number: 5,832,376
[45] Date of Patent: Nov. 3, 1998

[54] COPLANAR MIXER ASSEMBLY

[75] Inventors: Bert C. Henderson, Sunnyvale; Clifford A. Mohwinkel, San Jose; Mark V. Faulkner, Boulder Creek, all of Calif.

[73] Assignee: Endgate Corporation, Sunnyvale, Calif.

[21] Appl. No.: 679,259

[22] Filed: Jul. 12, 1996

[51] Int. Cl.$^6$ ...................................................... H04B 1/26
[52] U.S. Cl. ........................... 455/327; 455/330; 327/355
[58] Field of Search .................... 455/313, 323, 455/326, 327, 328, 330, 333, 318, 319; 327/355; 333/26, 247, 128

[56] References Cited

U.S. PATENT DOCUMENTS

| | | |
|---|---|---|
| 3,939,430 | 2/1976 | Dickens et al. . |
| 4,032,849 | 6/1977 | Gysel et al. . |
| 4,249,263 | 2/1981 | Shinkawa et al. . |
| 4,320,536 | 3/1982 | Dietrich . |
| 4,411,022 | 10/1983 | Clifton et al. . |
| 4,485,488 | 11/1984 | Houdart . |
| 4,542,535 | 9/1985 | Bates et al. . |
| 4,553,265 | 11/1985 | Clifton et al. . |
| 4,553,266 | 11/1985 | Bates et al. . |
| 4,607,394 | 8/1986 | Nightingale . |
| 4,739,519 | 4/1988 | Findley ..................................... 455/327 |
| 4,955,079 | 9/1990 | Connerney et al. . |
| 5,265,266 | 11/1993 | Trinh . |
| 5,610,563 | 3/1997 | Mohwinkel ............................ 333/128 |

*Primary Examiner*—Andrew Faile
*Assistant Examiner*—Christopher Onuaku
*Attorney, Agent, or Firm*—Steven J. Adamson; Edward B. Anderson

[57] ABSTRACT

Mixers assemblies including mixer cells, baluns, quadrature mixers and image reject mixers, etc. The mixer cell may contain CPW strip RF input and slot line strip LO input. LO signal return is provided through a flip-chip mounted to a mixer contact area and the CPW RF input is preferably coupled to the contact area through a distributed or flip-chip mounted capacitor. The use of two mixer cells in novel embodiments of quadrature and image reject mixers is disclosed. CPW to slot line power dividing baluns for use within and without such mixers are also disclosed.

21 Claims, 6 Drawing Sheets

COPLANAR MIXER ASSEMBLY

FIELD OF THE INVENTION

The present invention relates to mixer assemblies such as mixer cells, baluns, quadrature mixers, image reject mixers and the like. The present invention is directed towards improving performance and fabrication procedures for such assemblies, while reducing their size and fabrication costs.

BACKGROUND OF THE INVENTION

Prior art mixers may be generally characterized as having undesirably expansive layouts, using material that induces parasitics and being fabricated with techniques that are cumbersome and unnecessarily complex, amongst other disadvantageous aspects.

For example, U.S. Pat. No. 4,607,394, issued to Nightingale for a Single Balanced Planar Mixer, discloses a mixer in which the local oscillator (LO), intermediate frequency (IF) and low pass filter components are formed in microstrip, and the dipole antennas and radio frequency (RF) transmission lines extend outwardly therefrom on an exposed substrate. This design is disadvantageous in that it is fabricated in microstrip which requires metalization on both sides of a substrate and subsequent formation of interconnecting vias. The layout is also disadvantageous because the filter arrangements are dispersed and consume an undesirably large amount of substrate surface. In addition, the extension of the antennas and RF conductors requires special packaging and results in a larger, potentially more fragile device.

U.S. Pat. No. 4,542,535, issued to Bates et al. for a RF Balanced Mixer, and U.S. Pat. No. 4,739,519, issued to Findley for a Coplanar Microwave Balun, Multiplexer and Mixer Assemblies, also disclose mixers fabricated in microstrip and having disadvantageously expansive layouts. The device of Bates necessitates an air cavity above and below the substrate. These two patents also illustrate ground planes which extend to the edges of the substrate. Such ground planes may produce moding which results in significant reductions in gain at frequencies corresponding to quarter wavelength multiples of the ground plane length.

It is known in prior art mixers to provide an arrangement of diodes that form return paths for the LO signal (or other signals depending on mixer configuration). Conventional techniques for mounting such diode arrangements include chip diodes and beam lead mounting and the like. Each of these techniques, however, is known to induce parasitic lead inductance which may disadvantageously affects circuit performance.

Quadrature and image reject mixers which incorporate mixer cells have also been prone to expansive and potentially less than optimum layouts. For example, the requisite 90 degree phase delays are normally implemented using Lange or quadrature branch-line couplers which may be undesirably expensive, expansive and lossy.

SUMMARY OF THE INVENTION

Accordingly, it is an objective of the present invention to provide a mixer cell having an efficiently designed layout that reduces requisite substrate surface area.

It is another objective of the present invention to provide a mixer cell in which diodes or other electronic devices are mounted in a manner that reduces or eliminates uncontrolled parasitic inductance and the like.

It is another objective of the present invention to provide a mixer cell that is planar using slot line and CPW strip configuration.

It is another objective of the present invention to provide a quadrature mixer that incorporates such a mixer cell.

It is another objective of the present invention to provide a quadrature mixer wherein the 90 degree phase delay is achieved by a delay line configured in CPW strip that is one quarter of a design wavelength in length.

It is another objective of the present invention to provide a quadrature mixer wherein an IF band pass filtering element is achieved in such a manner as to reduce requisite substrate area.

And it is yet another objective of the present invention to provide a CPW to slot line balun power divider for use within or without such a quadrature mixer.

These and related objectives of the present invention are achieved by use of the coplanar mixer assemblies herein disclosed. In a first embodiment of the present invention, a mixer cell is disclosed that utilizes flip-chip mounted diodes to reduce or eliminate the uncontrolled parasitic lead inductance of the diode switching device.

In a second embodiment of the present invention, a mixer cell is disclosed that provides dispersed capacitive coupling of a CPW line to the common mixer contact area. In a third embodiment of the present invention, a mixer cell is disclosed in which the LO signal is provided on slot line strip and the RF signal is provided on CPW strip.

In another embodiment of the present invention, a quadrature mixer is disclosed in which an RF input circuit includes a delay line one quarter of a design wavelength in length for achieving a 90 degree phase shift. Other means for achieving a 90 degree phase shift are also disclosed, including those which support operation at a broader frequency range.

In another embodiment of the present invention, a quadrature mixer is disclosed which includes a balun power divider. The balun power divider may include a CPW configuration that divides into two slot line or a CPW configuration that divides into CPW that terminate in slot line, or the like. The equa-phase portions of the slot line are preferably connected by a termination resistance. In addition, the CPW and slot lines may be configured in strip.

In another embodiment of the present invention, a quadrature coupler is disclosed in which a flip-mounted device is utilized for signal return in the first and second mixer cells. Chip mounted devices for providing desired capacitance are also disclosed and these may include capacitors configured in parallel plate or as reverse biased diodes.

In yet another embodiment of the present invention, a band pass element for filtering RF signals is configured in such a manner as to reduce requisite substrate area. The band pass element may include a distributed capacitor configured in a coupled line, interdigitated, intercoiled or other pattern and/or a chip-mounted capacitor, amongst other elements.

The attainment of the foregoing and related advantages and features of the invention should be more readily apparent to those skilled in the art, after review of the following more detailed description of the invention taken together with the drawings.

DETAILED DESCRIPTION

The present invention is particularly suited for operation at microwave and millimeter wave frequencies, and the following description is directed to this application. It should be noted, however, that the present invention is also applicable to mixers operating at other frequencies and its use in such mixers and any necessary modifications and limitations thereof should be apparent to one skilled in the art given the teachings herein. It should also be noted that a certain designation of RF and LO has been given to the mixer assemblies which are described herein below. This designation may be interchanged with a known adjustment of filters and other components. It is intended that the present invention includes both designations and hence that the language in the claims be interpreted so as to include both designations. Furthermore, it should be recognized that the mixer assemblies taught herein may be used in both receive and transmit operations. Though use in a receive channel is primarily disclosed below, extension to a transmit channel is known in the art.

Figure 1:
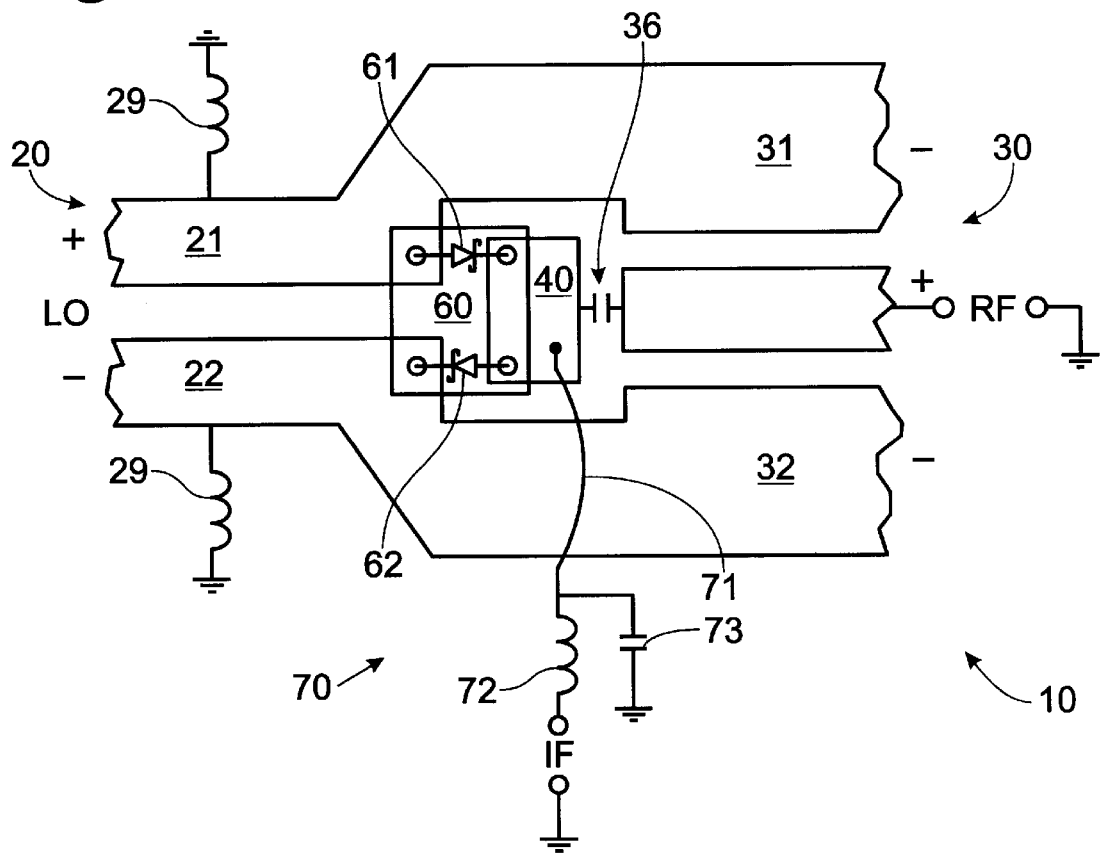
FIG. 1 is a schematic/physical diagram of a mixer cell in accordance with the present invention.

Referring to FIG. 1, a schematic diagram of a mixer cell 10 in accordance with the present invention is shown. The mixer cell 10 includes a slot line 20 for input of a local oscillating (LO) signal and a coplanar waveguide (CPW) 30 for input of a radio frequency (RF) signal. The slot line 20 and CPW 30 are preferably formed in strip configuration and the widths of conductive strips 21,22,31,32 preferably correspond to quarter wavelengths of frequencies significantly above that of the cell's design frequency. For example, if mixer cell 10 is designed to operate at 50 GHz, strips 21,22,31,32 are preferably designed to have widths that are a quarter wavelength of 150 GHz or more.

The use of slot line and CPW strips as opposed to conventional ground planes provides several advantages. These include elimination of moding which causes significant reductions in gain at frequencies corresponding to integer multiples of the quarter wavelength of conventional ground planes, more layout flexibility, higher density for DC (power) and RF (signal) lines, very low parasitics and low cost single side fabrication.

The strips 21,22,31,32 are formed integrally as shown and are inductively coupled to ground through inductors 29 to provide a signal return for the intermediate frequency (IF) signal.

The center or center conductor of CPW 30 preferably terminates in a capacitor 36 through which it is coupled to a contact area 40 which is a pad of conductive material. The capacitor 36 is preferably a distributed capacitor that functions effectively as a band pass filter, permitting RF frequencies to pass while blocking passage of IF frequencies. A suitable distributed capacitor configuration is that of distributed capacitor 136 illustrated in FIG. 2. The configuration of capacitor 36 in an end of CPW 30 achieves a compact design that minimizes requisite substrate area.

The contact area 40 is coupled through a pair of diodes 61,62 (which are preferably Schottky diodes) to slot line 20 to provide a signal return for the LO signal. Diode 61 is connected anode to cathode from slot line strip 21 to contact area 40 and diode 62 is connected anode to cathode from contact area 40 to slot line strip 22.

The diodes 61 and 62 are preferably fabricated in a flip-chip 60. A suitable device for flip mounting is the DMK 2790 chip by Alpha Industries of Woburn, Mass. The DMK 2790 provides a single Schottky diode and hence two DMK 2790 chips would be used, one each for diodes 61,62. The DMK 2790 chips are preferably mounted across slot line strip 21 or 22 and contact area 40 by conductive epoxy. Alternative flip-chip arrangements include having a desired electronic device fabricated in a semiconductor material, for example, fabricating the arrangement of diodes 61,62 in a Si or GaAs substrate, aligning the flip-chip and mounting it through ball-bonding or other known techniques. Flip-chip fabrication is known in the art. It should be recognized that although diodes are illustrated in FIG. 1, other equivalent electronic devices, for example, those including transistors could be used.

The use of a flip-chip eliminates beam leads and thereby minimizes parasitic lead inductance. Flip-chip 60 also provides, amongst other advantages, a one-step attach operation and no delays for epoxy cure time when ball-bonding or the like is utilized.

The intermediate frequency (IF) circuit 70 which is an output circuit when used in a receive channel includes a bond wire 71 coupled in series with a printed inductor 72 and shunt capacitor 73. The bond wire and inductor-shunt capacitor circuit form a low pass filter which isolates the RF and LO signals from the IF output signal. The requisite inductance can be realized by coil, quarter wavelength transmission line, bond wire, or planar spiral implementations, or a combination thereof. The requisite capacitance can be realized by chip, beam lead or interdigital implementations for a combination thereof. The selection of appropriate inductive and capacitive elements to create a desired low pass filter is known in the art.

The mixer cell 10 is preferably formed using high resolution thin film techniques on a ceramic substrate. Slot line 20, CPW 30, contact area 40 and bond wire 71 are preferably formed of gold. The inductor 72 and capacitor 73 are also preferably formed of patterned gold in the planar spiral and interdigital implementations, respectively.

There are many applications for mixer cell 10. One such application is use in a radio signal receive channel which may include an antenna, amplifiers, mixers, and filters, etc. It is known in receive channels that image noise can accompany noise adjacent to desired received signals, degrading system performance. Without means for eliminating this image signal, the IF output signal may include the image signal—LO difference in addition to the normally desired LO—RF difference. Image rejection is achieved through use of a suitable band pass filter (which may be expensive and consumptive of substrate surface area) or through phase cancellation with quadrature image rejection.

Conventional image reject mixers include a quadrature mixer which separates an input RF signal into two signal paths and creates a 90 degree phase delay in one of the signal paths. The power divided, quadrature RF signals are then mixed with the LO signal, causing a first and second IF signal to be generated. Through a known phase cancellation procedure, the two IF output signals are combined in such a manner that the RF image—LO signal is terminated, while the LO—RF signal is passed through for further processing. The use of the mixer cell 10 of FIG. 1 in such a quadrature mixer is now discussed.

Figure 2:
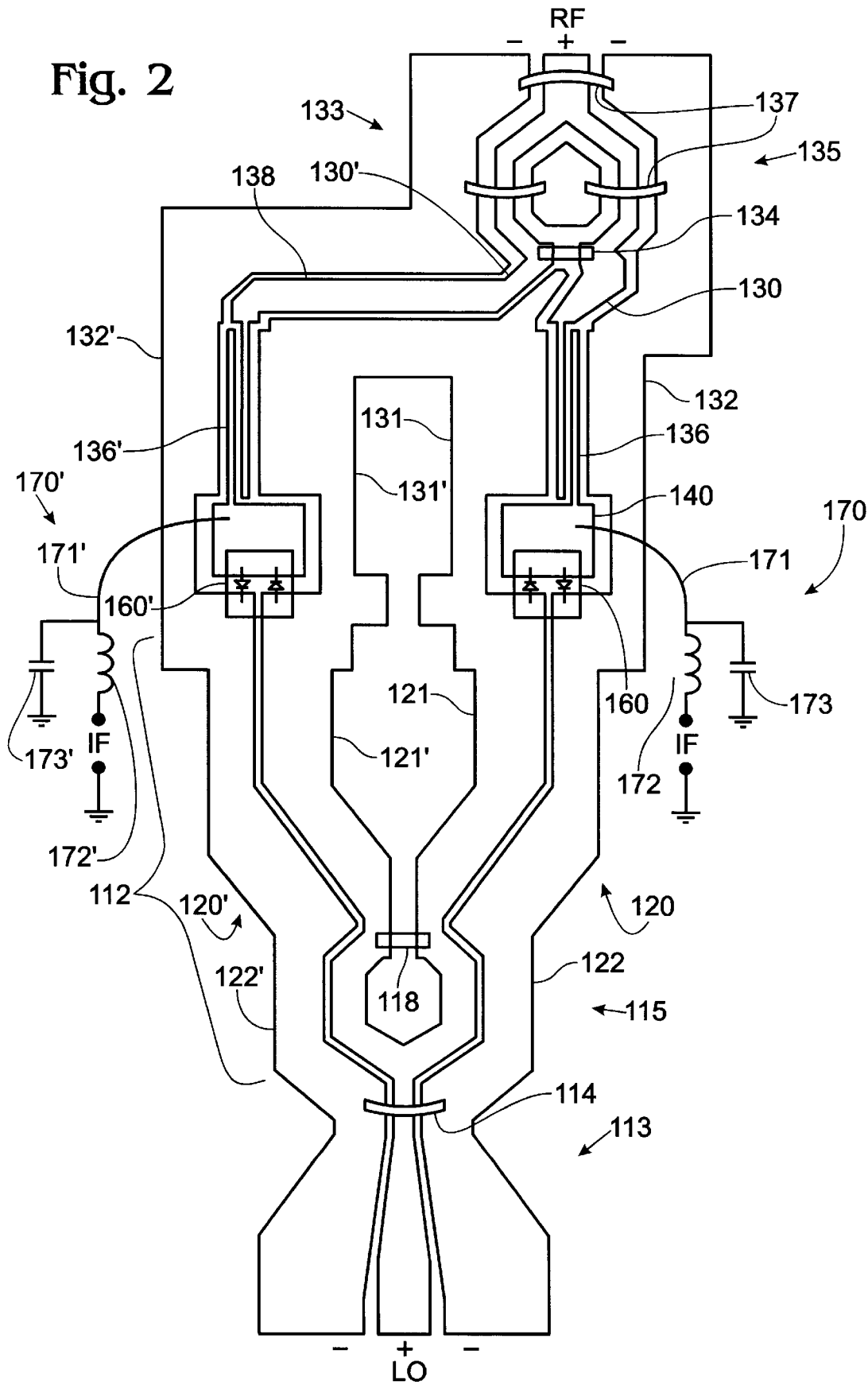
FIG. 2 is an assembly diagram of a quadrature mixer in accordance with the present invention incorporating the mixer cell of FIG. 1.

Referring to FIG. 2, an assembly diagram of a quadrature mixer 100 incorporating two of the mixer cells 10 of FIG. 1 is shown. The two occurrences of the mixer cell 10 in FIG. 2 are represented by the reference numbers 110 and 110'. The value in the tens and units place are the same to indicate that the components are analogous. Similarly, the other components of FIG. 1 that are essentially replicated in FIG. 2 are preceded by the number 1 in the hundreds place of their reference number. For example, slot line 20 of FIG. 1 is referred to as slot lines 120,120' in FIG. 2, etc.

The quadrature mixer 100 includes LO signal input through balun 112, RF signal input through CPW RF input circuit 133 and IF signal output through IF signal output circuits 170,170'.

The RF input circuit 133 includes a CPW power divider 135 which divides an RF input signal into a first CPW 130 and a second CPW 130'. The power divider includes a termination resistor 134 of preferably 100 Ohms for isolation of the first and second CPWs 130,130' and a plurality of bond wires 137 for enhanced grounding. Both the power divider 135 and CPWs 130,130' are preferably configured in CPW strip as shown.

A 90 degree phase delay line 138 is provided in second CPW 130'. The length of delay line 138 is preferably one quarter of a design wavelength. Such a dimension effectively induces a 90 degree phase shift. It should be recognized that delay line 138 provides adequate phase delay only for signals of a frequency that are close to the design wavelength. Establishing a cutoff frequency or range may depend on a particular application so specific limits cannot be given. General design guidelines, however, include, for example, that for an input frequency range of approximately 5%, the mixer 100 with strip delay line 138 will most likely function adequately (depending on the specific application), while for frequency ranges of 25% or more the quadrature mixer with delay line 138 will probably not perform adequately. If the desired range of frequencies does not accommodate a quarter wavelength delay line, then alternative delay mechanisms such as Lange and quadrature branch-line couplers or the like, discussed below, can be used.

The first and second CPW 130,130' each include a distributed capacitor 136,136', which is coupled to contact areas 140,140' in mixer cells 110,110', respectively. The capacitors 136,136' are formed between the return strips 131,132 and 131',132' of CPWs 130,130', respectively. The formation of the distributed capacitors 136,136' within CPWs 130,130' and adjacent contact areas 140,140' significantly reduces the amount of necessary substrate surface area.

Figure 3:
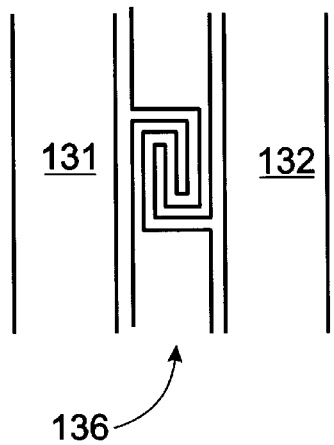
FIG. 3 is an assembly diagram for an alternative embodiment of a distributed capacitor for use in a quadrature mixer in accordance with the present invention.

Referring to FIG. 3, an alternative embodiment of distributed capacitor 136 is shown in which the capacitor is formed in an intercoiled pattern of coupled lines. This condensed pattern requires less substrate area. Other suitable condensed patterns include curved, interdigital, and angled patterns.

Referring again to FIG. 2, the LO signal is provided through a balun 112 which is coupled to a CPW feeder 113.

The balun is preferably CPW strip at its single ended end and slot line at its balanced end. The balun 112 includes a power divider 115 which splits the input CPW line 113 into two slot lines 120,120'. As is illustrated in FIG. 2, the power divider 115 initially expands the position of the slots of the CPW, then contracts them before a final division. A termination resistor 118 is preferably provided at the point of contraction to isolate slot lines 120,120'. Bond wires 114 couple the LO return lines in CPW strip and bond wire 116 couples the slot line return strips 122,122'. The arrangement of power divider 115, resistor 118 and bond wires 114,116 effectively form a CPW to slot line Wilkinson power divider.

The LO supply signal is provided to mixer cells 110,110' on slot line strips 121,121'. Flip-chips 160,160' connect slot lines 120,120' to contact areas 140,140', respectively. The arrangement of diodes in flip-chips 160,160' is as shown for flip chip 60 of FIG. 1, i.e., the diodes are connected in series and forward biased with respect to the LO supply signal. For the embodiment of FIG. 2, the arrangement of diodes in flip-chips 160,160' may be either symmetric or identical, the difference resulting in reversing output ports for image-LO and LO-image signals.

The IF output circuits 170,170' are coupled to contact areas 140,140' through inductive bond wires 171,171'. The IF output circuits 170,170' also include inductors 172,172' and shunt capacitors 173,173' as discussed above for IF output circuit 70 of FIG. 1.

The two IF output signals can be processed in a known manner to recover the desired LO—RF signal.

The components of quadrature mixer 100, with the exception of resistors 118,134 and flip-chips 160,160', are preferably formed of gold on a dielectric substrate. The resistors are preferably formed of tantalum nitride in a known process step preceding gold deposition.

Figure 4:
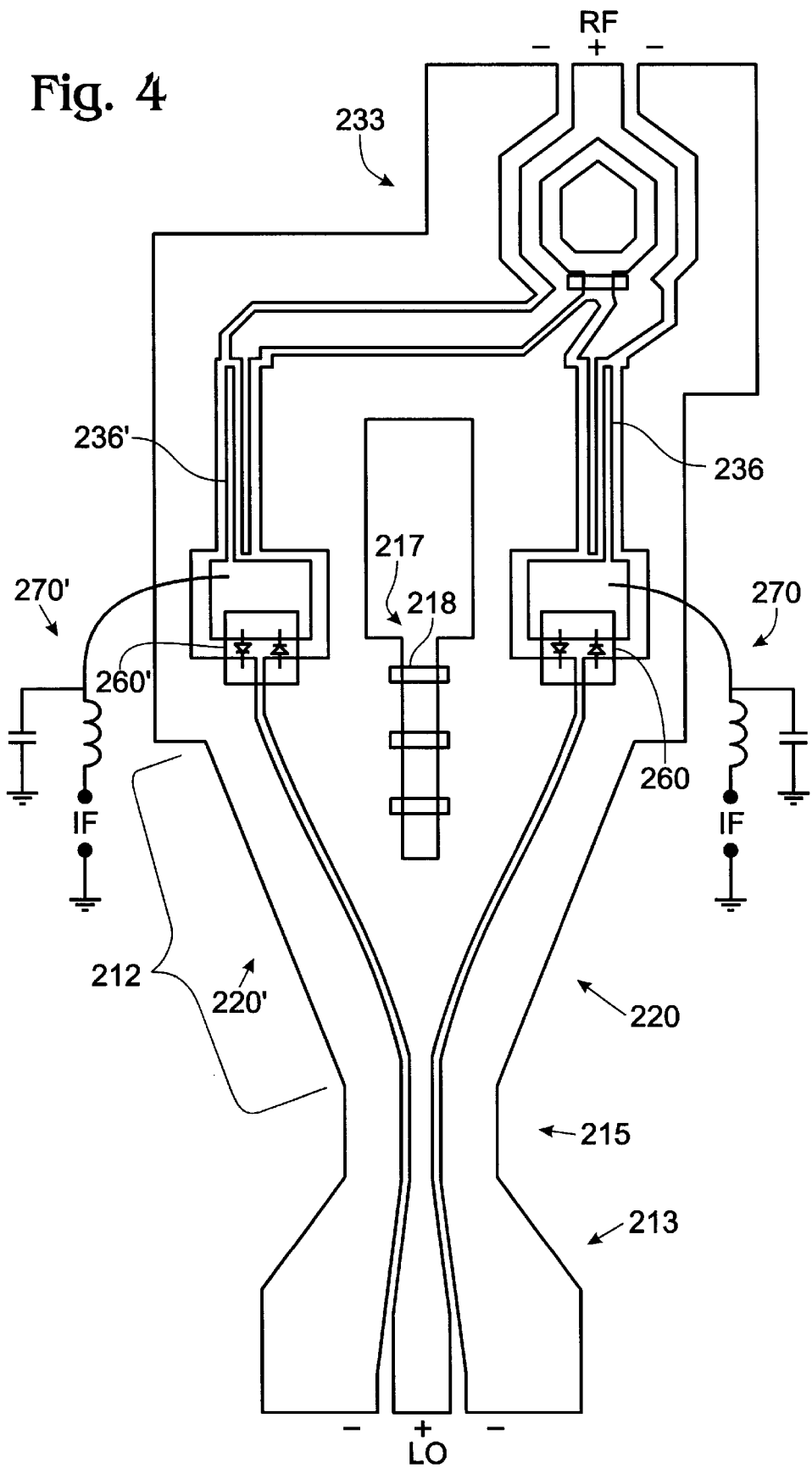
FIG. 4 is an assembly diagram of the quadrature mixer of FIG. 2 having a different balun configuration in accordance with the present invention.

Referring to FIG. 4, an assembly diagram of a quadrature mixer 200 having a different balun configuration in accordance with the present invention is shown. Mixer 200 is essentially the same as mixer 100 with a different balun arrangement. Like components include the RF input, mixer cell and IF output circuits. Accordingly, components in FIG. 4 that are analogous to components in FIG. 2 share the same value in the units and tens place, while having a 2 in the hundreds place as opposed to a 1.

Mixer 200 includes a quarter wavelength balun 212 which is different in configuration than balun 112 of FIG. 1. The LO signal is input via a CPW feeder 213 and is divided at power divider 215, which marks the beginning of balun 212, into a first and second 220,220' slot line. The slot lines 220,220' are isolated by termination resistors 218 which are provided across a quarter wavelength long gap 217.

Slot lines 220,220' are connected through flip-chips 260, 260' to contact areas 240,240', respectively. The RF input circuit 233 and IF output circuits 270,270' are the same as their counterparts in FIG. 2.

Figure 5:
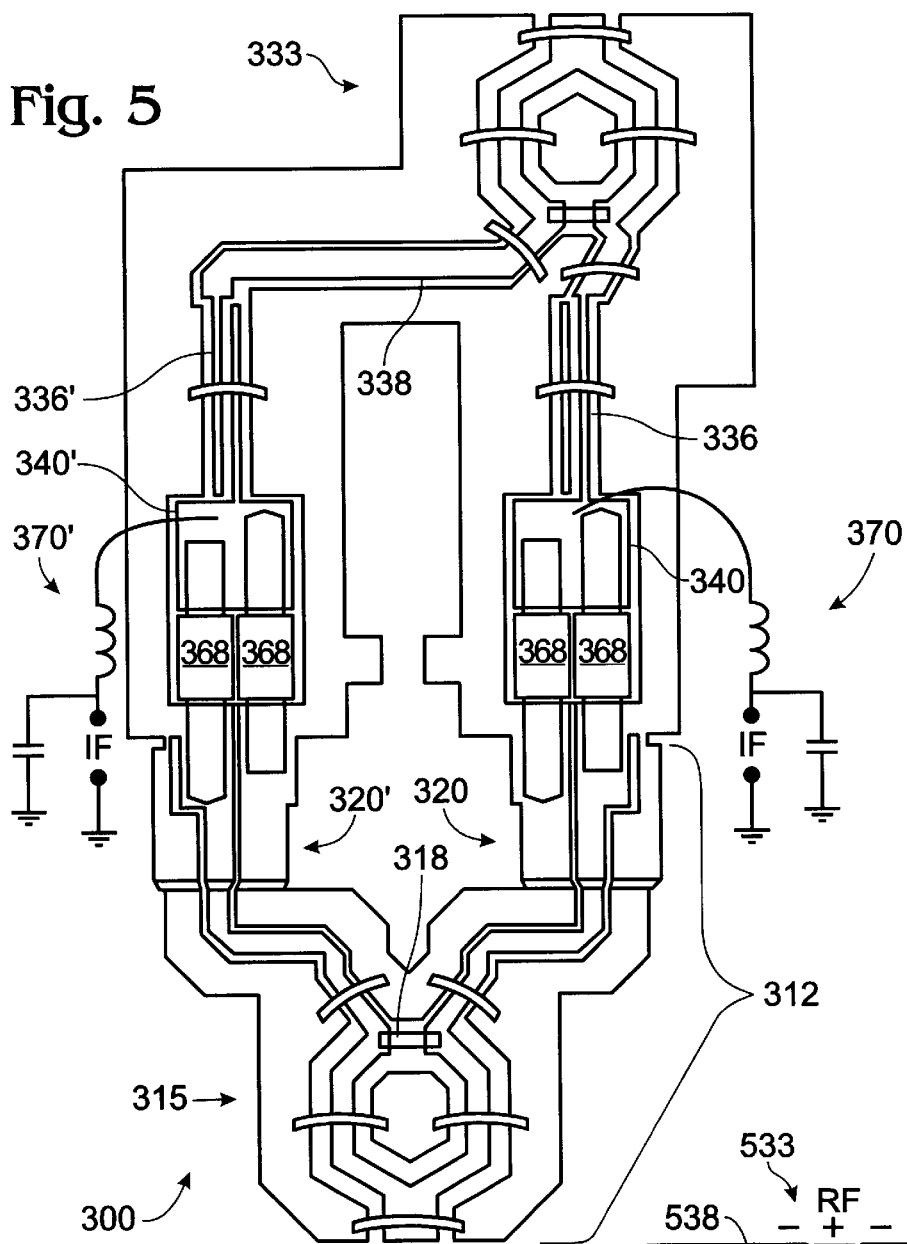
FIG. 5 is an assembly diagram of another quadrature mixer having another different balun configuration in accordance with the present invention.

Referring to FIG. 5, an assembly diagram of a quadrature mixer 300 having another different balun configuration in accordance with the present invention is shown. The mixer 300 is in large part analogous to mixer 100 of FIG. 2 and the reference numbers of like components have the same tens and units values, with a 3 replacing a 1 in the hundreds place.

Differences between mixer 300 and mixer 100 include that mixer 300 has a different balun configuration and utilizes beam lead diodes instead of flip-chip mounted diodes.

Balun 312 includes a CPW to CPW power divider 315. The first and second CPW outputs are isolated by a termination resistor 318 and transition into first and second slot lines 320 and 320', respectively.

Beam lead diodes 368 can be used in place of flip-chip mounted devices, such as flip-chip 160 of FIG. 1. Beam lead diodes are suitable when uncontrolled parasitic inductance levels need not be as low as those provided by flip-chip mounting and sufficient layout for beam lead mounting exists.

The RF input circuit 333, distributed capacitors 336,336', contact areas 340,340' and IF output circuits 370,370', and the like, are as described above.

Figure 6:
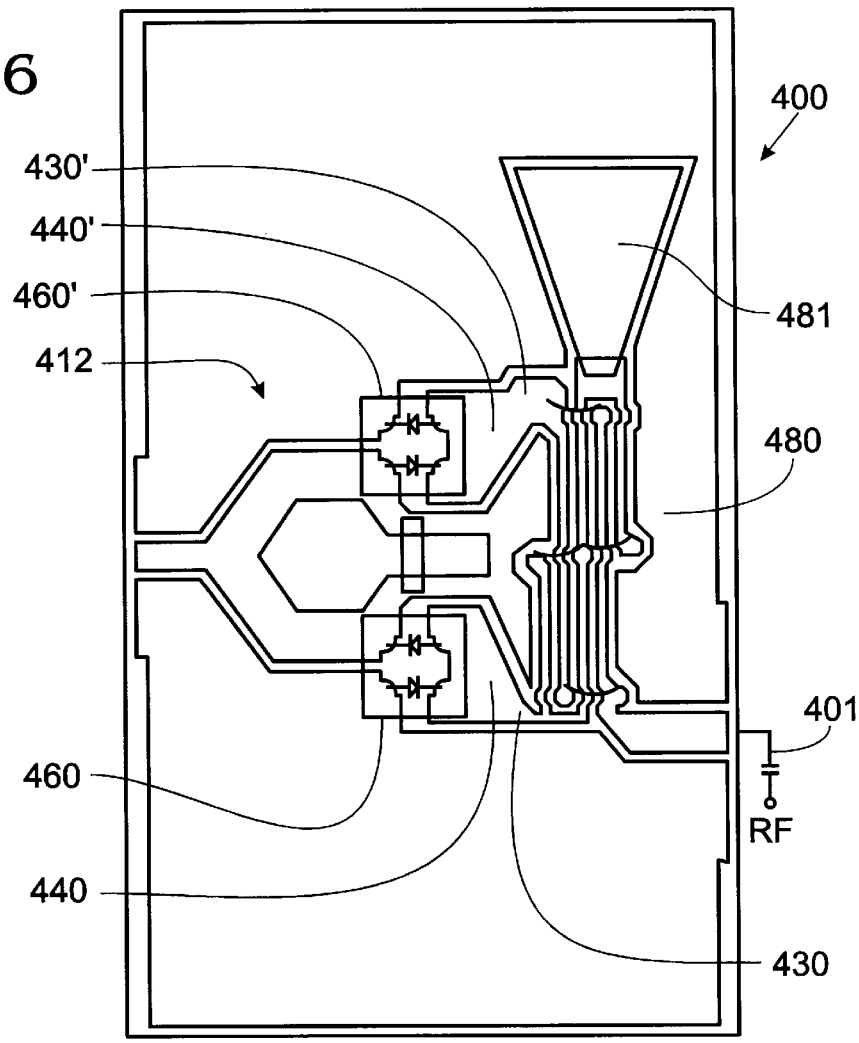
FIG. 6 is an assembly diagram of a quadrature mixer incorporating a Lange coupler in accordance with the present invention.

Referring to FIG. 6, an assembly layout of a quadrature mixer 400 for broader bandwidth operation in accordance with the present invention is shown. The configuration of mixer 400 has a reduced size relative to mixers 100,200,300 in part because the RF band pass element is placed in the RF input path upstream of the mixer, i.e., in a receiver channel immediately preceding the mixer 400. This "pre-RF input" RF band pass element is preferably implemented as a capacitor 401. Mixer 400 also illustrates use of a Lange coupler 480 for inducing a desired phase shift (as provided by delay line 138 of FIG. 2).

For use with characteristic 50 Ohm transmission lines, the input impedance of coupler 480 is 50 Ohms and the output impedance in paths 430,430' is approximately 100 Ohms. This up transformation of 50 to 100 Ohms is achieved by increasing the spacing between the conducting traces of the coupler 480 and the surrounding metalization. A fantail load 481 is connected to Lange coupler 480 and it is preferably formed as a layer of tantalum nitride extending under the metalization layer of coupler 480. The use of a fantail load 481 and Lange coupler 480 provide a broad bandwidth of operation. Note that a non-fantail load, such as an open stub quarter wavelength transmission line in connection with a 50 Ohm resistor, could be utilized when broader bandwidth operation is not desired. Alternatively, a capacitor realized in chip, beam-lead attached, or printed coupled strip form could replace fantail short 481.

In addition to Lange coupler 480, there are several other types of 90 degree phase shift elements that could be used in the RF input circuit. These include, but are not limited to, Schiffman variation couplers, branch line couplers, broadside coupled couplers, the semi-lumped quadrature divider 538 of FIG. 7, the coupling quadrature divider 638 of FIG. 8, the quadrature divider 738 of FIG. 9, and any other type of 90 degree hybrid.

Mixer 400 includes contact areas 440,440', flip-chips 460,460' and balun 412 which are analogous to their counterparts described herein. An IF output circuit is not shown, but would attach to the contact areas 440,440' and be configured as taught elsewhere herein.

Figure 7:
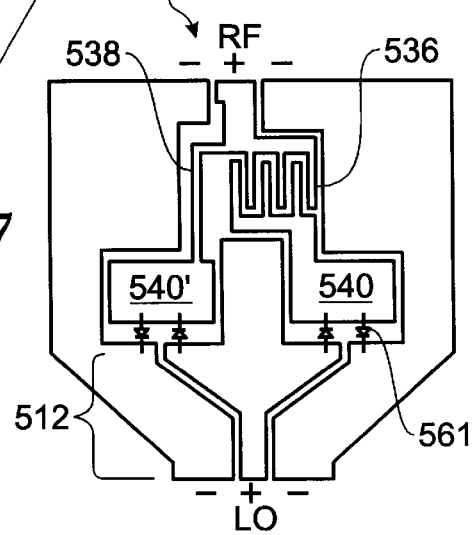
FIG. 7 is an assembly diagram of a quadrature mixer having a interdigitated capacitor band pass element and a phase shifting inductor.

Referring to FIG. 7, an assembly diagram of a quadrature mixer 500 having a semi-lumped interdigitated capacitor band pass element and a phase shift inductor in accordance with the present invention is shown.

The RF input circuit 533 includes an interdigitated capacitor 536 which is configured as an RF band pass element. Inductive trace 538 achieves an approximately 90 degree phase shift between signals propagated to the first 540 and second 540' contact areas. Signal return elements may be diodes 561 configured as taught herein or other suitable return devices. Balun 512 achieves a compact design and is analogous to balun 412 of FIG. 6. Balun 512 may be reduced in size even further and other balun configurations such as those of baluns 112,312 and the like could also be used. The IF output circuits (not shown) would be implemented as disclosed elsewhere herein.

Figure 8:
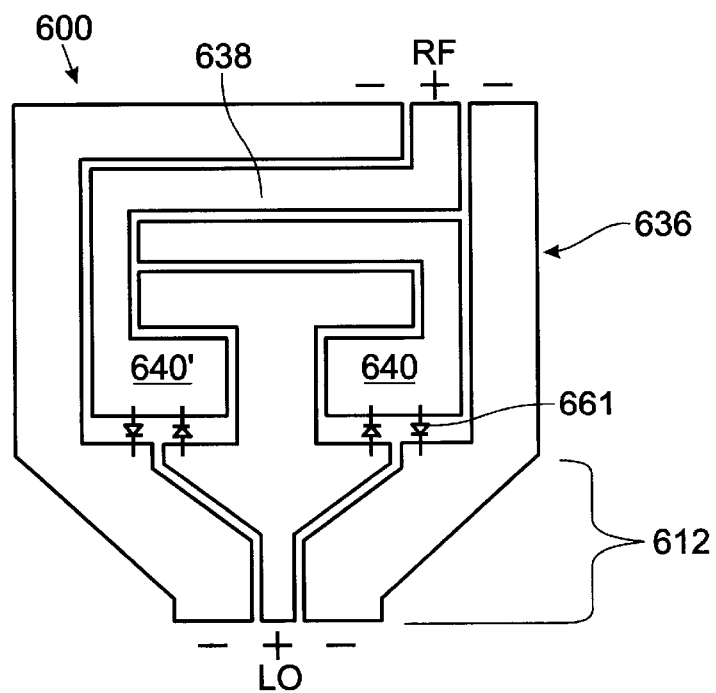
FIG. 8 is an assembly diagram of a quadrature mixer having a coupled delay line band pass element in accordance with the present invention.

Referring to FIG. 8, an assembly diagram of a quadrature mixer 600 having a coupled delay line band pass element in accordance with the present invention is shown.

The RF input circuit 633 includes a delay line 638 which induces an approximate 90 degree phase shift. The delay line 638 is positioned a fixed distance from a conducting trace of contact area 640 so as to form a distributed capacitor 636 along a portion of delay line 638. This configuration achieves a reduced size mixer relative to mixers 100,200, 300.

The contact areas 640,640', return devices 661, balun 612 and IF output circuits (not shown) are as discussed elsewhere herein. The balun 612 is essentially the same as balun 512 of FIG. 7.

Figure 9:
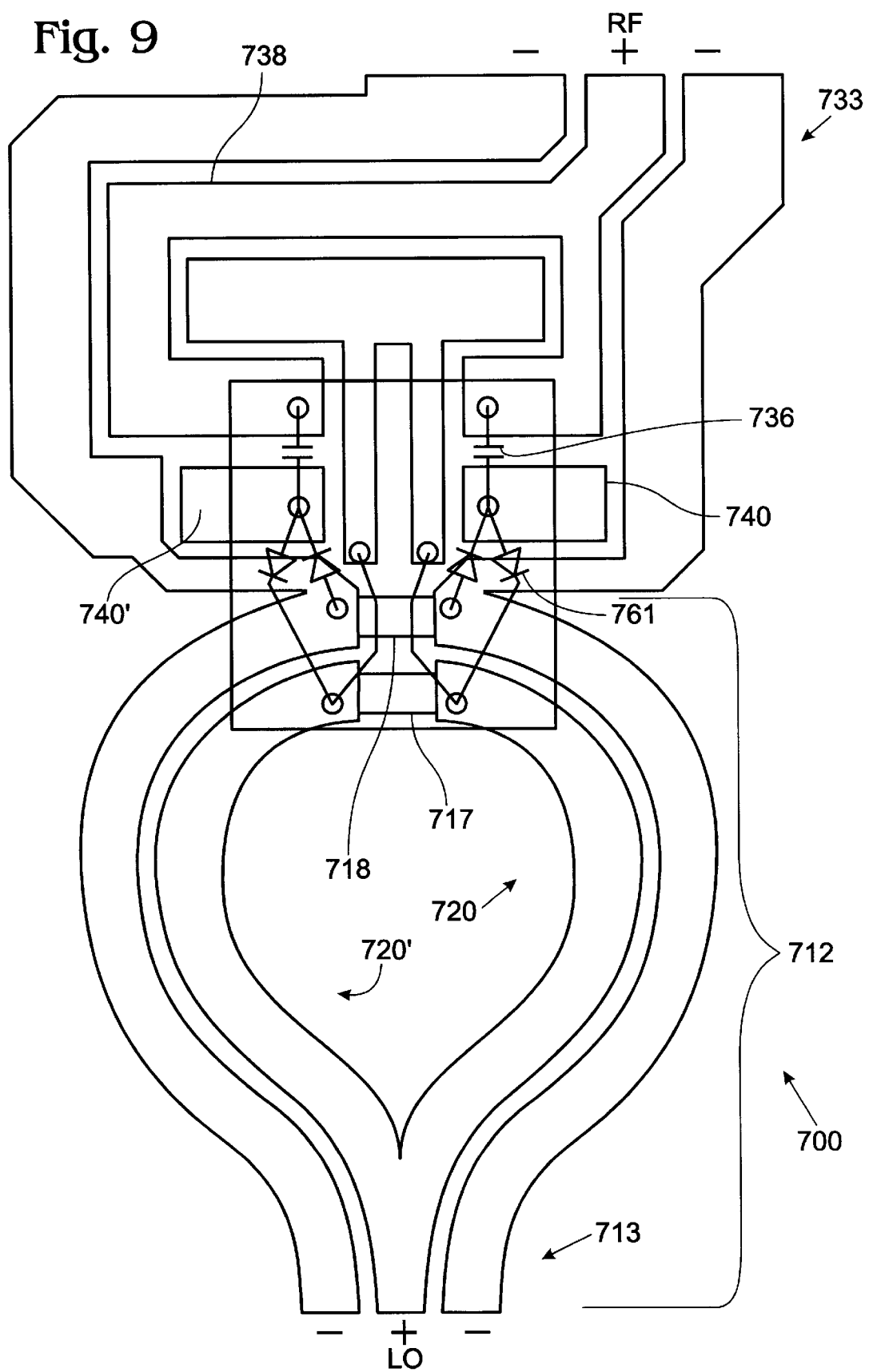
FIG. 9 is an assembly diagram of another embodiment of a quadrature mixer in accordance with the present invention.

Referring to FIG. 9, an assembly diagram of another embodiment of a quadrature mixer 700 in accordance with the present invention is shown.

The LO input of mixer 700 includes a balun 712 having a balanced Wilkinson power divider wherein a single ended input port 713 is divided into two balanced slot line output ports 720 (or A,A') and 720' (or B,B'). Points A–B are connected by termination resistor 717 and points A'–B' are connected by termination resistor 718.

The voltages at A and B are equal as are the voltages at A' and B'. Accordingly, for a signal input at the LO port, no LO input power is dissipated across either resistor 717,718. For signals input at A,A' or B,B', for example, from the RF input, this equipotential condition may no longer exist, resulting in a loss of energy across the resistors 717,718.

A flip-chip 760 includes RF band pass capacitors 736 and return elements 761 along with requisite conducting segments for return of the LO, RF and IF signals. Chip mounting the IF band pass capacitors reduces mixer size eliminating the surface area required to implement a distributed capacitor or the like. The capacitors 736 may be implemented as parallel plate capacitors or reversed biased diodes.

Other components of mixer 700, including RF input circuit 733 and delay line 738, contact areas 740,740', and IF output circuits (not shown), are as discussed above. It should be noted that the dimensions of the components of mixer 700 as well as those of other mixers herein may not be wholly in proportion as illustrated. Modifications, for example, to assure that all quarter wavelength segments are the same length, should be apparent to one skilled in the art.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

We claim:

1. A mixer cell, comprising:

a substrate;

slot line configured on said substrate for conducting a Local Oscillator (LO) signal;

a coplanar waveguide (CPW) configured on said substrate for conducting a Radio Frequency (RF) signal;

a contact area coupled to said CPW and spaced from said slot line;

a chip having terminals flip-mounted on said contact area and on said slot line, said chip containing a non-linear electronic device for returning said LO signal; and an Intermediate Frequency (IF) signal conductor coupled to said contact area for conducting an IF signal related to said contact area.

2. The mixer cell of claim 1, further comprising an RF band pass element formed in an end of said CPW proximate said contact area.

3. The mixer cell of claim 1, wherein said flip-mounted chip further comprises an RF band pass element coupling said CPW and said contact area.

4. The mixer cell of claim 1, wherein said slot line and CPW are configured in strip format.

5. A mixer cell, comprising:

a substrate;

slot line configured on said substrate for conducting a local oscillator (LO) signal;

a coplanar waveguide (CPW) configured on said substrate for conducting a radio frequency (RF) signal;

a contact area spaced a predefined distance from said slot line;

a non-linear electronic device connected between said slot line and said contact area for returning an LO and RF signal;

an RF band pass element positioned at an end of a center conductor of said RF CPW proximate said contact area for coupling said RF CPW to said contact area in such a manner as to filter for RF signals; and an intermediate frequency (IF) signal conductor connected to said contact area for conducting an IF signal relative to said contact area.

6. The mixer cell of claim 5, wherein said RF pass band element includes at least one from the group consisting of:

a chip mounted capacitor in a parallel plate configuration;

a chip mounted capacitor configured as a reverse biased diode;

a coupled line capacitor;

an interdigitated capacitor;

a delay line-coupled line capacitor; and a pre-RF input capacitive device.

7. The mixer cell of claim 6, wherein said non-linear electronic device is provided in a flip-mounted chip.

8. The mixer cell of claim 5, wherein said slot line and CPW are configured in strip format.

9. A quadrature mixer for use at microwave or millimeter wave frequencies, comprising:

an RF input means configured in coplanar waveguide (CPW) strip including means for dividing said input RF signal into first and second paths, and a delay line in said second path approximately one quarter of a design wavelength in length for inducing a 90 degree phase shift in a signal in said second path relative to said first path;

an RF band pass element coupled to said RF input means;

a first and second contact area coupled to said RF input means;

means for providing a local oscillating (LO) signal adjacent said first and second contact areas;

electronic device means mounted between said LO signal providing means and said first and second contact areas for returning an LO signal; and means for conducting an intermediate frequency (IF) signal relative to each of said first and second contact areas.

10. The mixer cell of claim 9, wherein said RF pass band element includes at least one from the group consisting of:

a chip mounted capacitor in a parallel plate configuration;

a chip mounted capacitor configured as a reverse biased diode;

a coupled line capacitor;

an interdigitated capacitor;

a delay line-coupled line capacitor; and a pre-RF input capacitive device.

11. The mixer of claim 9, wherein said electronic device is provided in a flip-mounted chip.

12. The mixer of claim 9, wherein said LO signal providing means includes a balun which bifurcates a CPW configuration at a single ended end to a first and second slot line configuration at a balanced end, said first and second slot lines respectively terminating adjacent said first and second contact areas.

13. A quadrature mixer, comprising:

an RF input means configured in coplanar waveguide (CPW) including means for dividing said input RF signal into first and second signal paths, and means for inducing a 90 degree phase shift in a signal in said second path relative to a signal in said first path;

first and second contact areas respectively coupled to said first and second signal paths;

an RF band pass element coupled to said RF input means from the group consisting of:

a chip mounted capacitor in a parallel plate configuration, a chip mounted capacitor configured as a reverse biased diode, a coupled line capacitor coupled between said RF input means and said contact areas, an interdigitated capacitor coupled between said RF input means and said contact areas, a delay line-coupled line capacitor coupled between said RF input means and said contact areas, and a pre-RF input capacitive device;

means for providing a local oscillating (LO) signal adjacent said first and second contact areas;

electronic device means mounted between said LO signal providing means and said first and second contact areas for returning an LO signal; and means for conducting an intermediate frequency (IF) signal relative to each of said first and second contact areas.

14. The mixer of claim 13, wherein said electronic device means is provided in a flip-mounted chip.

15. The mixer of claim 13, wherein said LO signal providing means includes a balun that bifurcates from CPW to first and second slot lines which terminate respectively adjacent said first and second contact areas; and wherein said RF input means and said balun are configured in strip format.

16. The mixer of claim 13, wherein said 90 degree phase shift inducing means comprises a Lange coupler.

17. The mixer of claim 13, further comprising a fantail short coupled to said 90 degree phase shift inducing means to facilitate broad bandwidth operation.

18. A quadrature mixer, comprising:

an RF input means configured in coplanar waveguide (CPW) including means for dividing said input RF signal into first and second signal paths, and means for inducing a 90 degree phase shift in a signal in said second path relative to a signal in said first path;

first and second contact areas coupled to said first and second paths, respectively;

means for providing a local oscillating (LO) signal adjacent said first and second contact areas;

a chip flip-mounted between said first and second contact areas and said LO providing means, said flip-mounted chip containing a non-linear electronic device for returning said LO signal; and means for conducting an intermediate frequency (IF) signal relative to each of said first and second contact areas.

19. The mixer of claim 18, wherein said LO signal providing means includes a balun that bifurcates from CPW to first and second slot lines which terminate respectively adjacent said first and second contact areas; and said flip-mounted chip is mounted between said first and second contact areas and said first and second slot lines.

20. The mixer of claim 19, further comprising an RF band pass element coupled to said RF input means from the group consisting of:

a chip mounted capacitor in a parallel plate configuration;

a chip mounted capacitor configured as a reverse biased diode;

a coupled line capacitor coupled between said RF input means and said contact areas;

an interdigitated capacitor coupled between said RF input means and said contact areas;

a delay line-coupled line capacitor coupled between said RF input means and said contact areas; and a pre-RF input capacitive device.

21. The mixer of claim 19, wherein said RF input and said balun are configured in strip format.

* * * * *